US010453535B2

(12) United States Patent
Rajwade et al.

(10) Patent No.: US 10,453,535 B2
(45) Date of Patent: Oct. 22, 2019

(54) SEGMENTED ERASE IN MEMORY

(71) Applicant: Intel Corporation, Santa Clara, CA (US)

(72) Inventors: Shantanu R. Rajwade, Santa Clara, CA (US); Akira Goda, Boise, ID (US); Pranav Kalavade, San Jose, CA (US); Krishna K. Parat, Palo Alto, CA (US); Hiroyuki Sanda, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 236 days.

(21) Appl. No.: 14/922,611

(22) Filed: Oct. 26, 2015

(65) Prior Publication Data
US 2017/0117049 A1 Apr. 27, 2017

(51) Int. Cl.
G11C 16/04 (2006.01)
G11C 16/16 (2006.01)
G11C 16/08 (2006.01)
G11C 16/34 (2006.01)

(52) U.S. Cl.
CPC .......... *G11C 16/16* (2013.01); *G11C 16/0441* (2013.01); *G11C 16/0458* (2013.01); *G11C 16/0466* (2013.01); *G11C 16/0483* (2013.01); *G11C 16/08* (2013.01); *G11C 16/3427* (2013.01); *G11C 16/3477* (2013.01)

(58) Field of Classification Search
CPC ..... G11C 16/0483; G11C 16/14; G11C 16/16; G06F 12/0246
See application file for complete search history.

(56) References Cited

U.S. PATENT DOCUMENTS

| 8,913,431 B1* | 12/2014 | Costa ................. G11C 16/0408 365/185.05 |
| 2006/0239111 A1 | 10/2006 | Shingo |
| 2009/0080258 A1 | 3/2009 | Walker |
| 2012/0140569 A1 | 6/2012 | Goda et al. |
| 2012/0257438 A1 | 10/2012 | Siau et al. |

(Continued)

FOREIGN PATENT DOCUMENTS

WO 2015038439 A1 3/2015

OTHER PUBLICATIONS

International Search Report and Written Opinion for International Patent Application No. PCT/US2016/052474, dated Jan. 3, 2017, 12 pages.

(Continued)

*Primary Examiner* — Uyen B Tran
(74) *Attorney, Agent, or Firm* — Jordan IP Law, LLC

(57) ABSTRACT

Systems, apparatuses and methods may provide for identifying a target sub-block of NAND strings to be partially or wholly erased in memory and triggering a leakage current condition in one or more target select gate drain-side (SGD) devices associated with the target sub-block. Additionally, the leakage current condition may be inhibited in one or more remaining SGD devices associated with remaining sub-blocks of NAND strings in the memory. In one example, triggering the leakage current condition in the one or more target SGD devices includes setting a gate voltage of the one or more target SGD devices to a value that generates a reverse voltage that exceeds a threshold corresponding to the leakage current condition.

25 Claims, 4 Drawing Sheets

(56) References Cited

U.S. PATENT DOCUMENTS

| | | | |
|---|---|---|---|
| 2013/0056814 A1* | 3/2013 | Higuchi | H01L 27/11582 257/314 |
| 2013/0279257 A1* | 10/2013 | Costa | G11C 5/02 365/185.17 |
| 2014/0043916 A1 | 2/2014 | Costa et al. | |
| 2014/0063947 A1 | 3/2014 | Ghodsi | |
| 2014/0321215 A1 | 10/2014 | Sakui | |
| 2015/0179271 A1 | 6/2015 | Nam et al. | |

OTHER PUBLICATIONS

International Preliminary Report on Patentability for International Patent Application No. PCT/US2016/052474, dated May 11, 2018, 9 pages.

Extended European Search Report for European Patent Application No. 16860454.4, dated Apr. 26, 2019, 11 pages.

\* cited by examiner

FIG. 2

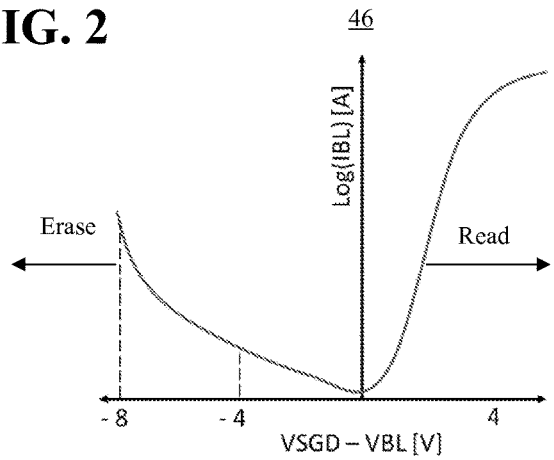

| Identify a target sub-block of NAND strings to be partially or wholly erased in memory |
52 ↙  ↓  54 ↘
| Trigger a leakage current condition in one or more target SGD devices associated with the target sub-block |
56 ↘ ↓
| Inhibit the leakage current condition in one or more remaining SGD devices associated with remaining sub-blocks of NAND strings in the memory |
58 ↘ ↓
| Inhibit the leakage current condition in one or more SGS devices associated with the target sub-block |
60 ↘ ↓
| Grade word line voltages applied to the target sub-block and the remaining sub-blocks |

| Identify a target NAND string to be erased in a target sub-block |
64 ↙ ↓ 66 ↘
| Trigger a leakage current condition in only one target SGD device associated with the target NAND string |
68 ↘ ↓
| Inhibit the leakage current condition in one or more remaining SGD devices associated with remaining NAND strings in the target sub-block |
70 ↘ ↓
| Inhibit the leakage current condition in one or more SGS devices associated with the target NAND string |
72 ↘ ↓
| Grade word line voltages applied to the target sub-block and the remaining sub-blocks |

SEGMENTED ERASE IN MEMORY

TECHNICAL FIELD

Embodiments generally relate to erasing memory structures.

BACKGROUND

Certain flash memory may be made up of arrays of NAND strings of transistors organized into large blocks, wherein erase operations in NAND flash may typically occur at the block level. Thus, a given erase operation (e.g., "erase") may apply to an entire block under conventional approaches. As systems increase in scale to include more transistors, block size may continue to increase exponentially. As a result, a substantial number of strings may be over-erased at the end of a given erase operation (e.g., with the end of the erase operation being dictated by the slowest string to erase). Furthermore, the inability to erase at higher granularity may lead to an increased number of write operations in devices such as solid state disks (SSDs).

BRIEF DESCRIPTION OF THE DRAWINGS

The various advantages of the embodiments will become apparent to one skilled in the art by reading the following specification and appended claims, and by referencing the following drawings, in which:

FIG. 2 shows a curve of an example of a current versus voltage relationship for a select gate drain-side (SGD) and source-side (SGS) device according to an embodiment;

FIG. 3A shows a flowchart of an example of a method of erasing one or more sub-blocks of NAND strings according to an embodiment;

FIG. 3B shows a flowchart of an example of a method of erasing one or more strings of a block in NAND Flash according to an embodiment;

DESCRIPTION OF EMBODIMENTS

Figure 1:
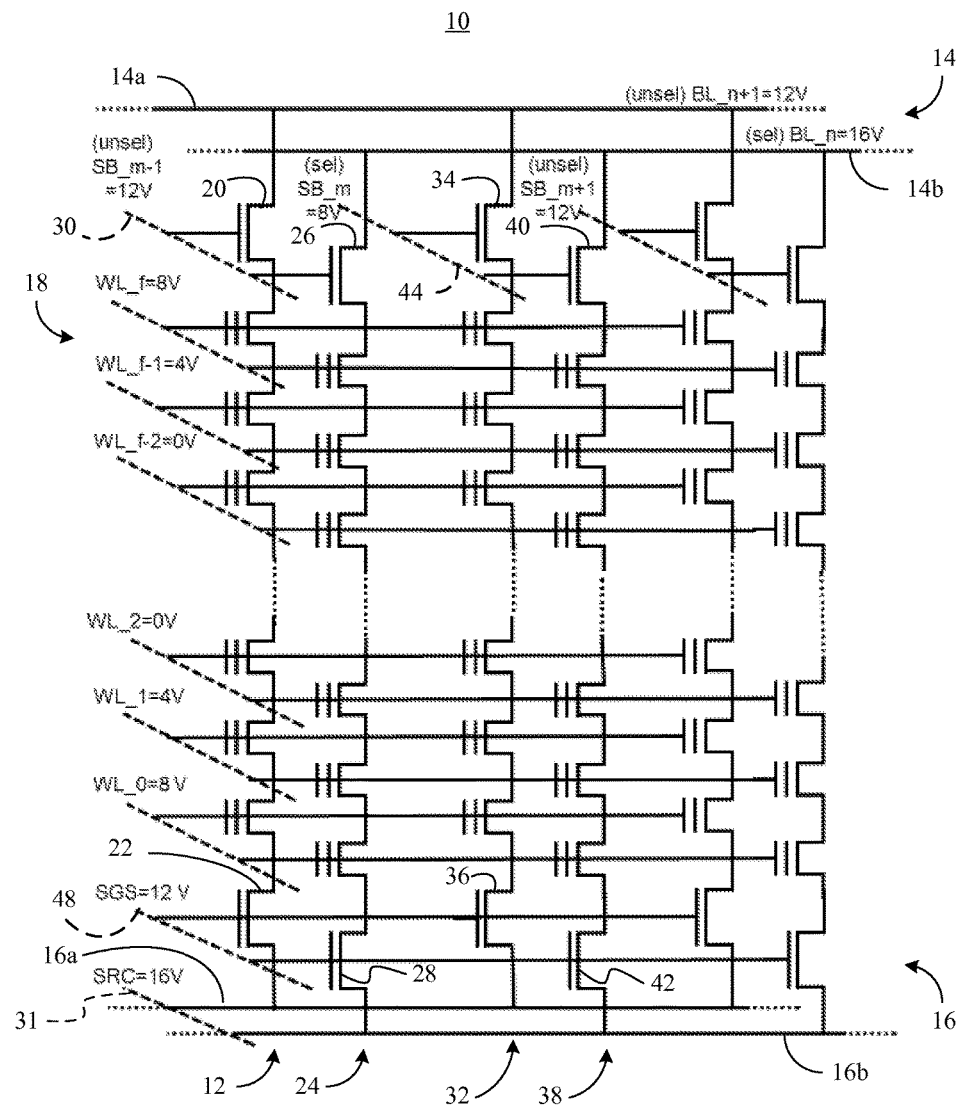
FIG. 1 is a schematic diagram of an example of an array of NAND strings according to an embodiment.

Turning now to FIG. 1, an array 10 of NAND strings is shown for a memory structure. The array 10 can be used for a NAND flash memory, three-dimensional (3D) NAND memory array devices, or other memory devices. The array 10 may generally be coupled to a plurality of bit lines 14 (14a, 14b), one or more source (SRC) lines 16 (16a, 16b), and a plurality of word lines (WL) 18. In the illustrated example, a first NAND string 12 of transistors (e.g., floating-gate metal oxide semiconductor/FGMOS transistors) is coupled to a first bit line 14a (e.g., BL_n+1) via a first select gate drain-side (SGD) device 20. The first NAND string 12 may also be coupled to a first source line 16a via a first select gate source-side (SGS) device 22. Similarly, a second NAND string 24 of transistors may be coupled to a second bit line 14b (e.g., BL_n) via a second SGD device 26. The illustrated second NAND string 24 is also coupled to a second source line 16b via a second SGS device 28. A common SGD select line 30 may be coupled to the gates of the first SGD device 20 and the second SGD device 26. Because the first NAND string 12 and the second NAND string 24 share the common SGD select line 30, the first NAND string 12 and the second NAND string 24 may be considered to be in the same sub-block of memory (e.g., SB_m−1).

Additionally, a third NAND string 32 of transistors may be coupled to the first bit line 14a via a third SGD device 34 and to the first source line 16a via a third SGS device 36. In the illustrated example, a fourth NAND string 38 is coupled to the second bit line 14b via a fourth SGD device 40 and to the second source line 16b via a fourth SGS device 42. Because a common SGD select line 44 is coupled to the illustrated gates of the third SGD device 34 and the fourth SGD device 40, the third NAND string 32 and the fourth NAND string 38 may be considered to be in the same sub-block of memory (e.g., SB_m). A certain number of bit lines (e.g., n=16 KB or 16*8*1024) may represent a page of memory.

Erase operations may generally involve clearing the state of the transistors in the array 10. In the illustrated example, erasing may generally be accomplished by selectively triggering leakage current conditions at the bit line (BL) junction and/or SRC junction of the select gates in the array 10. As will be discussed in greater detail, conducting erase operations from the drain-side may enable substantially higher granularity to be achieved (e.g., sub-block level, string level). With continued reference to FIGS. 1 and 2, a curve 46 is shown in which the reverse bias voltage of an SGD device (VSGD-VBL) is plotted against the log of the absolute value of the bit line current (Log(IBL)). The illustrated curve 46 demonstrates that when the reverse bias voltage exceeds a particular threshold (e.g., −8V in the example shown), the current increases exponentially and a condition similar to gate induced drain leakage (GIDL) occurs. The leakage current may be used to effectively short the NAND string to the bit line/source voltage, wherein the shorting clears the state of the transistors in the NAND string coupled to the SGD device in question.

For example, with reference to FIG. 1, in order to erase only the sub-block containing the third NAND string 32 and the fourth NAND string 38, a leakage current condition may be triggered in the third SGD device 34 and the fourth SGD device 40 by generating a sufficiently high reverse bias voltage in those devices 34, 40. In order to generate the appropriate reverse bias voltage in the third SGD device 34, the voltage difference between the first bit line 14a and the common SGD select line 44 may be set at a sufficiently low value (e.g., −8V or lower). For example, the voltage of the first bit line 14a might be set to 16V (although 12V is shown) while the voltage of the common SGD select line 44 is set to 8V (as shown). Similarly, in order to generate the appropriate reverse bias voltage in the fourth SGD device 40, the voltage of the second bit line 14b may be set to 16V (as shown) while the voltage of the common SGD select line 44 is set to 8V (as shown). The resulting leakage current may flow through the SGD devices 34, 40 and into the NAND strings 32, 38, respectfully, causing the NAND strings 32, 38 to be erased.

Of particular note is that the source-side of the array 10 may lack sufficient granularity to support sub-block level or string level erasing because the illustrated source lines 16 are connected to a common source line 31 and are shared by all sub-blocks within a block. Accordingly, the leakage current condition may be prevented from occurring (e.g., inhibited) on the source-side by ensuring that the reverse bias voltage of the SGS devices 22, 28, 36, 42 does not exceed the threshold corresponding to the leakage current condition. Thus, the voltage difference between the first source line 16a and a common SGS select line 48 may be set at a sufficiently high value (e.g., −4V or higher). For example, the voltage of the source lines 16 might be set to 16V while the voltage of the common SGS select line 48 is set to 12V.

In addition, the word line voltages may be graded to facilitate erasing from the drain-side and prevent erasing from the source-side. More particularly, the transistors near the drain-side "edge" (e.g., WL_f, WL_f-1, WL_f-2) may be given voltages that begin at a level low enough (e.g., 8V) to trigger the leakage current condition at the outermost word line (e.g., WL_f) only at the SGD device(s) selected for erasing. Thus, the grading may facilitate erasing from the drain-side at the sub-block or string level of granularity. Additionally, the transistors near the source-side edge (e.g., WL_0, WL_1, WL_2) may be given voltages that begin at a level high enough (e.g., 8V) to inhibit the leakage current condition at the outermost word line (e.g., WL_0) for the entire block.

In order to conduct erases at the string level (e.g., only partially erase a sub-block), individual control of the bit line voltages may be conducted. For example, the fourth NAND string 38 may be erased without erasing the third NAND string 32 by triggering the leakage current condition in the fourth SGD device 40 while preventing the leakage current condition in the third SGD device 34. Thus, the voltage of the first bit line 14a might be set to 12V (as shown) while the voltage of the common SGD select line 44 is set to 8V in order to inhibit (e.g., unselect/"unsel") the leakage current condition in the SGD device 34. The voltage of the second bit line 14b, on the other hand, may be set to 16V (as shown) while the voltage of the common SGD select line 44 is set to 8V in order to select (e.g., "sel") the fourth SGD device 40, as already discussed. Accordingly, the resulting leakage current may flow through only the fourth SGD device 40 and into the fourth NAND string 38, causing the fourth NAND string 38 to be erased. Table I below summarizes the combinations of SGD and BL voltages, and the resulting state of the string.

TABLE I

| | BL (sel) = 16 V | BL (unsel) = 12 V |
|---|---|---|
| SGD (sel) = 8 V | Erase | Inhibit |
| SGD (unsel) = 12 V | Inhibit | Inhibit |

FIG. 3A shows a method 50 of erasing a sub-block of NAND strings. The method 50 be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

Illustrated processing block 52 provides for identifying a target sub-block of NAND strings to be partially or wholly erased in memory. A leakage current condition may be triggered at block 54 in one or more target select gate drain-side (SGD) devices associated with the target sub-block. Block 54 may include, for example, setting a gate voltage of the one or more target SGD devices to a value that generates a reverse bias voltage that exceeds a threshold corresponding to the leakage current condition. In one example, the gate voltage is set via a plurality of (e.g., two or more) gate pulses in order to avoid erase disturbances on inhibited strings. Additionally, the leakage current condition may be inhibited at block 56 in one or more remaining SGD devices associated with remaining sub-blocks of NAND strings in the memory. Block 56 may include, for example, setting a gate voltage of the one or more remaining SGD devices to a value that does not generate a reverse bias voltage that exceeds the threshold corresponding to the leakage current condition.

In one example, block 58 inhibits the leakage current condition in one or more select gate source-side (SGS) devices associated with the target sub-block. Additionally, word line voltages applied to the target sub-block and the remaining sub-blocks may be graded at block 60. The grading may facilitate erasing the target sub-block from the drain-side and prevent erasing the target sub-block from the source side.

FIG. 3B shows a method 62 of partially erasing a sub-block of NAND strings. The method 62 be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

Illustrated processing block 64 provides for identifying a target NAND string to be erased in a target sub-block. A leakage current condition may be triggered at block 66 in only one target SGD device associated with the target NAND string. Block 66 may include setting a bit line voltage applied to a drain of the one target SGD device to a value that generates a reverse bias voltage that exceeds a threshold corresponding to the leakage current condition. In one example, the bit line voltage is set via a plurality of (e.g., two or more) drain pulses in order to avoid erase disturbances on inhibited strings. Additionally, illustrated block 68 inhibits the leakage current condition in one or more remaining SGD devices associated with remaining NAND strings in the target sub-block. Block 68 may include setting a bit line voltage applied to a drain of the one or more remaining SGD devices to a value that does not generate a reverse bias voltage that exceeds the threshold. In one example, the leakage current condition is inhibited at block 70 in one or more SGS devices associated with the target NAND string. Block 70 may be applied to multiple strings simultaneously. Moreover, block 72 may grade word line voltages applied to the target sub-block and the remaining sub-blocks.

Figure 4:
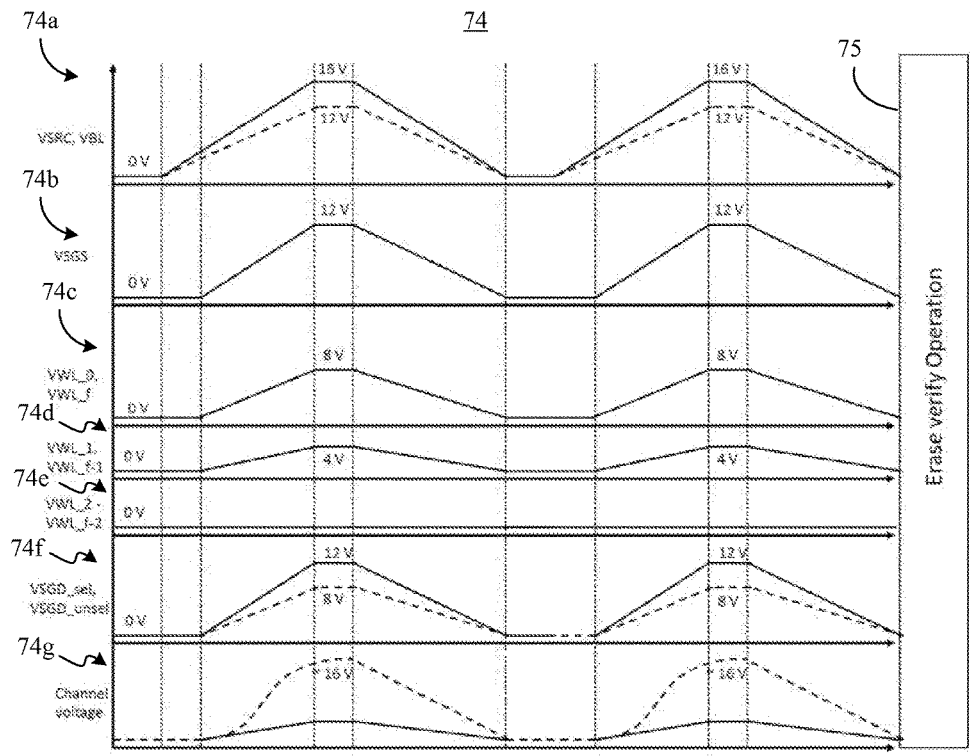
FIG. 4 shows a plot of an example of a set of voltage waveforms according to an embodiment.

FIG. 4 shows a set of voltage waveforms 74 (74a-74g) illustrating an example scenario of voltage versus time for all nodes during one erase pulse in a sub-block erase operation. The actual erase pulse width may depend on the leakage characteristics of the SGD/SGS devices. A conventionally long erase pulse (e.g., which does not inhibit and erase strings in the same block simultaneously) may be divided into multiple short pulses (e.g., target SGD gate pulses and/or drain pulses) to avoid erase disturbances on inhibited strings (e.g., pillars) before an eventual erase verify operation 75. The time spacing between short pulses and the width of each pulse may depend upon the transistor attributes of the inhibited and selected strings. Performance of the erase verify operation 75 may include deciding which SGDs/BLs are to be inhibited in the next set of erase pulses.

A first waveform 74a shows the source line voltage (VSRC) and bit line voltage (VBL) with the dashed line representing the unselected VBL for bit line n, and the solid line representing VSRC and the selected VBL for all other bit lines. The selected VBL may be set via a plurality of drain pulses to avoid erase disturbances on inhibited strings. A second waveform 74b shows the select gate source-side voltage (VSGS). A third waveform 74c shows the "edge" word line voltages (VWL) zero and f, a fourth waveform 74d shows the word line voltages one and f-1, and a fifth waveform 74e shows the word line voltages two through f-2. Additionally, a sixth waveform 74f shows the selected and unselected select gate drain-side voltage (VSGD) with the dotted line representing the selected VSGD for sub-block m and the solid line representing VSGD for all other sub-blocks. The selected VSGD may be set via a plurality of gate pulses to avoid erase disturbances on inhibited strings. Moreover, a seventh waveform 74g shows the channel voltage, with the dotted line representing the erase string and the solid line representing the inhibit string.

Figure 5:
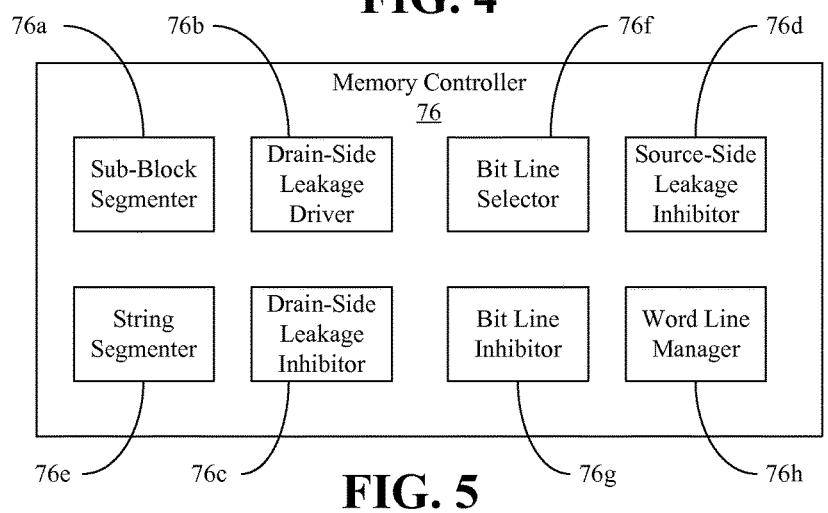
FIG. 5 is a block diagram of an example of a memory controller according to an embodiment.

FIG. 5 shows a memory controller 76 (76a-76h) that may implement one or more aspects of the method 50 (FIG. 3A) and/or the method 62 (FIG. 3B), already discussed. The memory controller 76 may therefore include logic instructions, configurable logic and/or fixed-functionality logic hardware. In the illustrated example, a sub-block segmenter 76a may identify a target sub-block of NAND strings to be partially or wholly erased in memory and a drain-side leakage driver 76b may trigger a leakage current condition in one or more target select drain-side (SGD) devices associated with the target sub-block. The memory controller 76 may also include a drain-side leakage inhibitor 76c to inhibit the leakage current condition in one or more remaining SGD devices associated with remaining sub-blocks of NAND strings in the memory. The illustrated memory controller 76 also includes a source-side leakage inhibitor 76d to inhibit the leakage current condition in one or more select gate source-side (SGS) devices associated with the target sub-block.

In one example, the drain-side leakage driver 76b sets a gate voltage of the one or more target SGD devices to a value that generates a reverse bias voltage that exceeds a threshold corresponding to the leakage current condition. Moreover, the drain-side leakage inhibitor 76c may set a gate voltage of the one or more remaining SGD devices to a value that does not generate a reverse bias voltage that exceeds the threshold corresponding to the leakage current condition.

The memory controller 76 may also include a string segmenter 76e that identifies a target NAND string to be erased in the target sub-block. In such a case, the leakage current condition may be triggered in only one target SGD device associated with the target NAND string and the leakage current condition may be inhibited in one or more remaining SGD devices associated with remaining NAND strings in the target sub-block. Moreover, a bit line selector 76f may set, via a plurality of drain pulses, a bit line voltage applied to a drain of the one target SGD device to a value that generates a reverse bias voltage that exceeds a threshold corresponding to the leakage current condition. The memory controller 76 may also include a bit line inhibitor 76g to set a bit line voltage applied to a drain of the one or more remaining SGD devices to a value that does not generate a reverse bias voltage that exceeds the threshold. In one example, a word line manager 76h may grade word line voltages applied to the target sub-block and the remaining sub-blocks.

Figure 6:
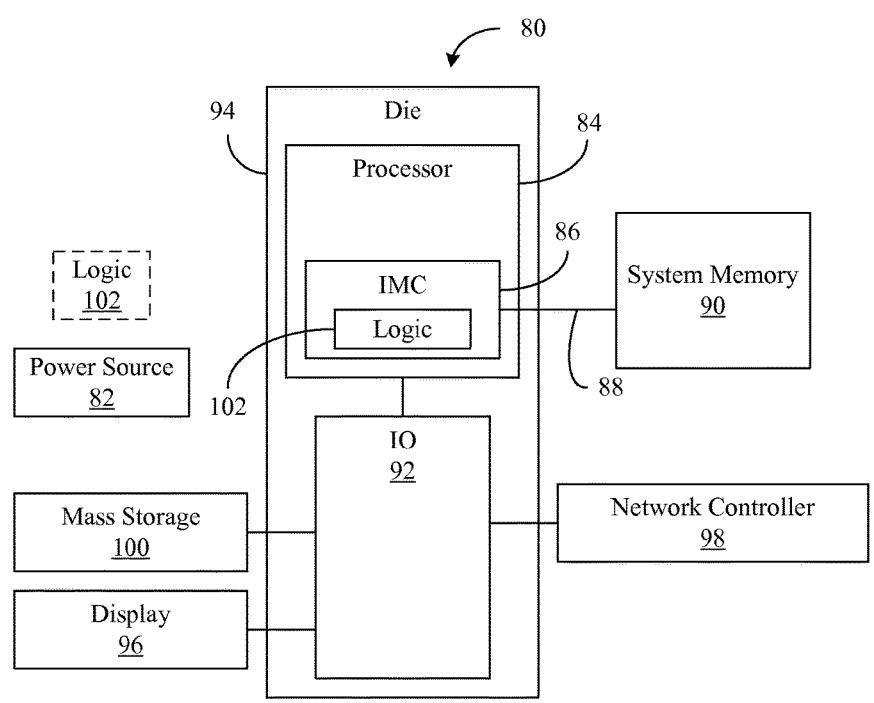
FIG. 6 is a block diagram of an example of a system according to an embodiment.

FIG. 6 shows a performance-enhanced computing system 80. The computing system 80 may generally be part of an electronic device/platform having computing functionality (e.g., personal digital assistant/PDA, notebook computer, tablet computer, server), communications functionality (e.g., smart phone), imaging functionality, media playing functionality (e.g., smart television/TV), wearable functionality (e.g., watch, eyewear, headwear, footwear, jewelry), vehicular functionality (e.g., car, truck, motorcycle), etc., or any combination thereof. In the illustrated example, the system 80 includes a power source 82 to supply power to the system 80 and a processor 84 having an integrated memory controller (IMC) 86, which may use a bus 88 to communicate with a system memory 90. The system memory 90 may include, for example, dynamic RAM (DRAM) configured as one or more memory modules such as, for example, dual inline memory modules (DIMMs), small outline DIMMs (SODIMMs), etc.

The illustrated system 80 also includes an input output (IO) module 92 implemented together with the processor 84 on a semiconductor die 94 as a system on chip (SoC), wherein the IO module 92 functions as a host device and may communicate with, for example, a display 96 (e.g., touch screen, liquid crystal display/LCD, light emitting diode/LED display), a network controller 98, and mass storage 100 (e.g., hard disk drive/HDD, optical disk, flash memory, etc.). The IMC 86 may include logic 102 that identifies a target sub-block of NAND strings to be partially or wholly erased in the memory 90 and triggers a leakage current condition in one or more target SGD devices associated with the target sub-block. The logic 102 may also inhibit the leakage current condition in one or more remaining SGD devices associated with remaining sub-blocks of NAND strings in the memory 90. Thus, the logic 102 may implement one or more aspects of the method 50 (FIG. 3A) and/or the method 62 (FIG. 3B), already discussed. The logic 102, which may be implemented in logic instructions, configurable logic and/or fixed-functionality logic hardware, may optionally be implemented elsewhere in the system 80 such as, for example, in a module containing the system memory 90, the IO module 92, and so forth.

Additional Notes and Examples:

Example 1 may include a memory controller apparatus comprising a sub-block segmenter to identify a target sub-block of NAND strings to be partially or wholly erased in memory, a drain-side leakage driver to trigger a leakage current condition in one or more target select gate drain-side (SGD) devices associated with the target sub-block, wherein the drain-side leakage driver is to set, via a plurality of gate pulses, a gate voltage of the one or more target SGD devices to a value that generates a reverse bias voltage that exceeds a threshold corresponding to the leakage current condition, a drain-side leakage inhibitor to inhibit the leakage current condition in one or more remaining SGD devices associated with remaining sub-blocks of NAND strings in the memory, wherein the drain-side leakage inhibitor is to set a gate voltage of the one or more remaining SGD devices to a value that does not generate a reverse bias voltage that exceeds the threshold, and a source-side leakage inhibitor to inhibit the leakage current condition in one or more select gate source-side (SGS) devices associated with the target sub-block.

Example 2 may include the apparatus of Example 1, further including a string segmenter to identify a target NAND string to be erased in the target sub-block, wherein the leakage current condition is to be triggered in only one target SGD device associated with the target NAND string and the leakage current condition is to be inhibited in one or more remaining SGD devices associated with remaining NAND strings in the target sub-block.

Example 3 may include the apparatus of Example 2, further including a bit line selector to set, via a plurality of drain pulses, a bit line voltage applied to a drain of the one target SGD device to a value that generates a reverse bias voltage that exceeds the threshold, and a bit line inhibitor to set a bit line voltage applied to a drain of the one or more remaining SGD devices to a value that does not generate a reverse bias voltage that exceeds the threshold.

Example 4 may include the apparatus of any one of Examples 1 to 3, further including a word line manager to grade line voltages applied to the target sub-block and the remaining sub-blocks.

Example 5 may include a granularity-enhanced computing system comprising at least one processor, a network interface communicatively coupled to the at least one processor, a memory comprising a plurality of blocks, wherein each block comprises a plurality of sub-blocks and each sub-block includes a plurality of NAND strings, and a memory controller communicatively coupled to the at least one processor and the memory, the memory controller comprising a sub-block segmenter to identify a target sub-block of NAND strings to be partially or wholly erased in the memory, a drain-side leakage driver to trigger a leakage current condition in one or more target select gate drain-side (SGD) devices associated with the target sub-block, and a drain-side leakage inhibitor to inhibit the leakage current condition in one or more remaining SGD devices associated with remaining sub-blocks of NAND strings in the memory.

Example 6 may include the system of Example 5, wherein the drain-side leakage driver is to set, via a plurality of gate pulses, a gate voltage of the one or more target SGD devices to a value that generates a reverse bias voltage that exceeds a threshold corresponding to the leakage current condition.

Example 7 may include the system of Example 5, wherein the drain-side leakage inhibitor is to set a gate voltage of the one or more remaining SGD devices to a value that does not generate a reverse bias voltage that exceeds a threshold corresponding to the leakage current condition.

Example 8 may include the system of Example 5, wherein the memory controller further includes a source-side leakage inhibitor to inhibit the leakage current condition in one or more select gate source-side (SGS) devices associated with the target sub-block.

Example 9 may include the system of Example 5, wherein the memory controller further includes a string segmenter to identify a target NAND string to be erased in the target sub-block, wherein the leakage current condition is to be triggered in only one target SGD device associated with the target NAND string and the leakage current condition is to be inhibited in one or more remaining SGD devices associated with remaining NAND strings in the target sub-block.

Example 10 may include the system of Example 9, wherein the memory controller further includes a bit line selector to set, via a plurality of drain pulses, a bit line voltage applied to a drain of the one target SGD device to a value that generates a reverse bias voltage that exceeds a threshold corresponding to the gate induced leakage condition, and a bit line inhibitor to set a bit line voltage applied to a drain of the one or more remaining SGD devices to a value that does not generate a reverse bias voltage that exceeds the threshold.

Example 11 may include the system of any one of Examples 5 to 10, wherein the memory controller further includes a word line manager to grade word line voltages applied to the target sub-block and the remaining sub-blocks.

Example 12 may include a memory controller apparatus comprising a sub-block segmenter to identify a target sub-block of NAND strings to be partially or wholly erased in memory, a drain-side leakage driver to trigger a leakage current condition in one or more target select gate drain-side (SGD) devices associated with the target sub-block, and a drain-side leakage inhibitor to inhibit the leakage current condition in one or more remaining SGD devices associated with remaining sub-blocks of NAND strings in the memory.

Example 13 may include the apparatus of Example 12, wherein the drain-side leakage driver is to set, via a plurality of gate pulses, a gate voltage of the one or more target SGD devices to a value that generates a reverse bias voltage that exceeds a threshold corresponding to the leakage current condition.

Example 14 may include the apparatus of Example 12, wherein the drain-side leakage inhibitor is to set a gate voltage of the one or more remaining SGD devices to a value that does not generate a reverse bias voltage that exceeds a threshold corresponding to the leakage current condition.

Example 15 may include the apparatus of Example 12, further including a source-side leakage inhibitor to inhibit the leakage current condition in one or more select gate source-side (SGS) devices associated with the target sub-block.

Example 16 may include the apparatus of Example 12, further including a string segmenter to identify a target NAND string to be erased in the target sub-block, wherein the leakage current condition is to be triggered in only one target SGD device associated with the target NAND string and the leakage current condition is to be inhibited in one or more remaining SGD devices associated with remaining NAND strings in the target sub-block.

Example 17 may include the apparatus of Example 16, further including a bit line selector to set, via a plurality of drain pulses, a bit line voltage applied to a drain of the one target SGD device to a value that generates a reverse bias voltage that exceeds a threshold corresponding to the gate induced leakage condition, and a bit line inhibitor to set a bit line voltage applied to a drain of the one or more remaining SGD devices to a value that does not generate a reverse bias voltage that exceeds the threshold.

Example 18 may include the apparatus of any one of Examples 12 to 17, further including a word line manager to grade word line voltages applied to the target sub-block and the remaining sub-blocks.

Example 19 may include a method of operating a memory controller comprising identifying a target sub-block of NAND strings to be partially or wholly erased in memory, triggering a leakage current condition in one or more target select gate drain-side (SGD) devices associated with the target sub-block, and inhibiting the leakage current condition in one or more remaining SGD devices associated with remaining sub-blocks of NAND strings in the memory.

Example 20 may include the method of Example 19, wherein triggering the leakage current condition in the one or more target SGD devices includes setting, via a plurality of gate pulses, a gate voltage of the one or more target SGD devices to a value that generates a reverse bias voltage that exceeds a threshold corresponding to the leakage current condition.

Example 21 may include the method of Example 19, wherein inhibiting the leakage current condition in the one or more remaining SGD devices includes setting a gate voltage of the one or more remaining SGD devices to a value that does not generate a reverse bias voltage that exceeds a threshold corresponding to the leakage current condition.

Example 22 may include the method of Example 19, further including inhibiting the leakage current condition in one or more select gate source-side (SGS) devices associated with the target sub-block.

Example 23 may include the method of Example 19, further including identifying a target NAND string to be erased in the target sub-block, wherein the leakage current condition is triggered in only one target SGD device associated with the target NAND string and the leakage current condition is inhibited in one or more remaining SGD devices associated with remaining NAND strings in the target sub-block.

Example 24 may include the method of Example 23, wherein triggering the leakage current condition in the one target SGD device includes setting, via a plurality of drain pulses, a bit line voltage applied to a drain of the one target SGD device to a value that generates a reverse bias voltage that exceeds a threshold corresponding to the leakage current condition.

Example 25 may include the method of Example 23, wherein inhibiting the leakage current condition in the one or more remaining SGD devices includes setting a bit line voltage applied to a drain of the one or more remaining SGD devices to a value that does not generate a reverse bias voltage that exceeds the threshold.

Example 26 may include a memory controller apparatus comprising means for identifying a target sub-block of memory to be partially or wholly erased, means for triggering a leakage current condition in one or more target select gate drain-side (SGD) devices associated with the target sub-block, and means for inhibiting the leakage current condition in one or more remaining SGD devices associated with remaining sub-blocks of the memory.

Example 27 may include the apparatus of Example 26, wherein the means for triggering the leakage current condition in the one or more target SGD devices includes means for setting, via a plurality of gate pulses, a gate voltage of the one or more target SGD devices to a value that generates a reverse bias voltage that exceeds a threshold corresponding to the leakage current condition.

Example 28 may include the apparatus of Example 26, wherein the means for inhibiting the leakage current condition in the one or more remaining SGD devices includes means for setting a gate voltage of the one or more remaining SGD devices to a value that does not generate a reverse bias voltage that exceeds a threshold corresponding to the leakage current condition.

Example 29 may include the apparatus of Example 26, further including means for inhibiting the leakage current condition in one or more select gate source-side (SGS) devices associated with the target sub-block.

Example 30 may include the apparatus of Example 26, further including means for identifying a target NAND string to be erased in the target sub-block, wherein the leakage current condition is to be triggered in only one target SGD device associated with the target NAND string and the leakage current condition is to be inhibited in one or more remaining SGD devices associated with remaining NAND strings in the target sub-block.

Example 31 may include the apparatus of Example 30, wherein the means for triggering the leakage current condition in the one target SGD device includes means for setting, via a plurality of drain pulses, a bit line voltage applied to a drain of the one target SGD device to a value that generates a reverse bias voltage that exceeds a threshold corresponding to the leakage current condition.

Example 32 may include the apparatus of Example 30, wherein the means for inhibiting the leakage current condition in the one or more remaining SGD devices includes setting a bit line voltage applied to a drain of the one or more remaining SGD devices to a value that does not generate a reverse bias voltage that exceeds the threshold.

Thus, techniques described herein may use increased erase granularity to provide for a tighter erase distribution, which may in turn provide several advantages for the array. For example, when the erased distribution is tighter, the programmed cell aggression is reduced. This aggression is commonly known as floating gate to floating gate coupling (occurs due to capacitive coupling between adjacent NAND cells). Reduced coupling can lead to tighter placement of cell VTs (voltage thresholds) and reduce raw bit error rate. Moreover, effective electrical block size may also be reduced when coupled with different programming schemes.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An apparatus comprising:
a sub-block segmenter to identify a target sub-block of memory to be partially or wholly erased;
a drain-side leakage driver to trigger a leakage current condition in one or more target select gate drain-side (SGD) devices associated with the target sub-block, wherein the drain-side leakage driver is to set, via a plurality of gate pulses, a gate voltage of the one or more target SGD devices to a value that generates a reverse bias voltage that exceeds a threshold corresponding to the leakage current condition;
a drain-side leakage inhibitor to inhibit the leakage current condition in one or more remaining SGD devices associated with remaining sub-blocks of memory, wherein the drain-side leakage inhibitor is to set a gate voltage of the one or more remaining SGD devices to a value that does not generate a reverse bias voltage that exceeds the threshold; and
a source-side leakage inhibitor to inhibit the leakage current condition in one or more select gate source-side (SGS) devices associated with the target sub-block,
wherein the target sub-block includes a common SGD select line to connect a gate of a first SGD device of a first NAND string of the target sub-block to a gate of a second SGD device of a second NAND string of the target sub-block, and
wherein the first NAND string is connected to a first source line and the second NAND string is connected to a second source line.

2. The apparatus of claim 1, further including a string segmenter to identify a target NAND string to be erased in the target sub-block, wherein the leakage current condition is to be triggered in only one target SGD device associated with the target NAND string and the leakage current condition is to be inhibited in one or more remaining SGD devices associated with remaining NAND strings in the target sub-block.

3. The apparatus of claim 2, further including:
a bit line selector to set, via a plurality of drain pulses, a bit line voltage applied to a drain of the one target SGD device to a value that generates a reverse bias voltage that exceeds the threshold; and
a bit line inhibitor to set a bit line voltage applied to a drain of the one or more remaining SGD devices to a value that does not generate a reverse bias voltage that exceeds the threshold.

4. The apparatus of claim 1, further including a word line manager to grade line voltages applied to the target sub-block and the remaining sub-blocks.

5. A system comprising:
at least one processor;
a network interface communicatively coupled to the at least one processor;
a memory comprising a plurality of blocks, wherein each block comprises a plurality of sub-blocks and each sub-block includes a plurality of NAND strings; and
a memory controller communicatively coupled to the at least one processor and the memory, the memory controller comprising,
a sub-block segmenter to identify a target sub-block of the memory to be partially or wholly erased,
a drain-side leakage driver to trigger a leakage current condition in one or more target select gate drain-side (SGD) devices associated with the target sub-block, and
a drain-side leakage inhibitor to inhibit the leakage current condition in one or more remaining SGD devices associated with remaining sub-blocks of the memory,
wherein the target sub-block includes a common SGD select line to connect a gate of a first SGD device of a first NAND string of the target sub-block to a gate of a second SGD device of a second NAND string of the target sub-block, and
wherein the first NAND string is connected to a first source line and the second NAND string is connected to a second source line.

6. The system of claim 5, wherein the drain-side leakage driver is to set, via a plurality of gate pulses, a gate voltage of the one or more target SGD devices to a value that generates a reverse bias voltage that exceeds a threshold corresponding to the leakage current condition.

7. The system of claim 5, wherein the drain-side leakage inhibitor is to set a gate voltage of the one or more remaining SGD devices to a value that does not generate a reverse bias voltage that exceeds a threshold corresponding to the leakage current condition.

8. The system of claim 5, wherein the memory controller further includes a source-side leakage inhibitor to inhibit the leakage current condition in one or more select gate source-side (SGS) devices associated with the target sub-block.

9. The system of claim 5, wherein the memory controller further includes a string segmenter to identify a target NAND string to be erased in the target sub-block, wherein the leakage current condition is to be triggered in only one target SGD device associated with the target NAND string and the leakage current condition is to be inhibited in one or more remaining SGD devices associated with remaining NAND strings in the target sub-block.

10. The system of claim 9, wherein the memory controller further includes:
a bit line selector to set, via a plurality of drain pulses, a bit line voltage applied to a drain of the one target SGD device to a value that generates a reverse bias voltage that exceeds a threshold corresponding to the leakage current condition; and
a bit line inhibitor to set a bit line voltage applied to a drain of the one or more remaining SGD devices to a value that does not generate a reverse bias voltage that exceeds the threshold.

11. The system of claim 5, wherein the memory controller further includes a word line manager to grade word line voltages applied to the target sub-block and the remaining sub-blocks.

12. An apparatus comprising:
a sub-block segmenter to identify a target sub-block of memory to be partially or wholly erased;
a drain-side leakage driver to trigger a leakage current condition in one or more target select gate drain-side (SGD) devices associated with the target sub-block; and a drain-side leakage inhibitor to inhibit the leakage current condition in one or more remaining SGD devices associated with remaining sub-blocks of the memory, wherein the target sub-block includes a common SGD select line to connect a gate of a first SGD device of a first NAND string of the target sub-block to a gate of a second SGD device of a second NAND string of the target sub-block, and wherein the first NAND string is connected to a first source line and the second NAND string is connected to a second source line.

13. The apparatus of claim 12, wherein the drain-side leakage driver is to set, via a plurality of gate pulses, a gate voltage of the one or more target SGD devices to a value that generates a reverse bias voltage that exceeds a threshold corresponding to the leakage current condition.

14. The apparatus of claim 12, wherein the drain-side leakage inhibitor is to set a gate voltage of the one or more remaining SGD devices to a value that does not generate a reverse bias voltage that exceeds a threshold corresponding to the leakage current condition.

15. The apparatus of claim 12, further including a source-side leakage inhibitor to inhibit the leakage current condition in one or more select gate source-side (SGS) devices associated with the target sub-block.

16. The apparatus of claim 12, further including a string segmenter to identify a target NAND string to be erased in the target sub-block, wherein the leakage current condition is to be triggered in only one target SGD device associated with the target NAND string and the leakage current condition is to be inhibited in one or more remaining SGD devices associated with remaining NAND strings in the target sub-block.

17. The apparatus of claim 16, further including:
a bit line selector to set, via a plurality of drain pulses, a bit line voltage applied to a drain of the one target SGD device to a value that generates a reverse bias voltage that exceeds a threshold corresponding to the leakage current condition; and
a bit line inhibitor to set a bit line voltage applied to a drain of the one or more remaining SGD devices to a value that does not generate a reverse bias voltage that exceeds the threshold.

18. The apparatus of claim 12, further including a word line manager to grade word line voltages applied to the target sub-block and the remaining sub-blocks.

19. A method comprising:
connecting a common select gate drain-side (SGD) select line to a gate of a first SGD device of a first NAND string of a target sub-block of memory to a gate of a second SGD device of a second NAND string of the target sub-block;
connecting the first NAND string to a first source line and connecting the second NAND string to a second source line;
identifying the target sub-block of memory to be partially or wholly erased;
triggering a leakage current condition in one or more target SGD devices associated with the target sub-block; and
inhibiting the leakage current condition in one or more remaining SGD devices associated with remaining sub-blocks of the memory.

20. The method of claim 19, wherein triggering the leakage current condition in the one or more target SGD devices includes setting, via a plurality of gate pulses, a gate voltage of the one or more target SGD devices to a value that generates a reverse bias voltage that exceeds a threshold corresponding to the leakage current condition.

21. The method of claim 19, wherein inhibiting the leakage current condition in the one or more remaining SGD devices includes setting a gate voltage of the one or more remaining SGD devices to a value that does not generate a reverse bias voltage that exceeds a threshold corresponding to the leakage current condition.

22. The method of claim 19, further including inhibiting the leakage current condition in one or more select gate source-side (SGS) devices associated with the target sub-block.

23. The method of claim 19, further including identifying a target NAND string to be erased in the target sub-block, wherein the leakage current condition is triggered in only one target SGD device associated with the target NAND string and the leakage current condition is inhibited in one or more remaining SGD devices associated with remaining NAND strings in the target sub-block.

24. The method of claim 23, wherein triggering the leakage current condition in the one target SGD device includes setting, via a plurality of drain pulses, a bit line voltage applied to a drain of the one target SGD device to a value that generates a reverse bias voltage that exceeds a threshold corresponding to the leakage current condition.

25. The method of claim 23, wherein inhibiting the leakage current condition in the one or more remaining SGD devices includes setting a bit line voltage applied to a drain of the one or more remaining SGD devices to a value that does not generate a reverse bias voltage that exceeds a threshold.

* * * * *